United States Patent
Kobayashi

(10) Patent No.: US 10,536,626 B2
(45) Date of Patent: Jan. 14, 2020

(54) INFRARED IMAGING DEVICE, FIXED PATTERN NOISE CALCULATION METHOD, AND FIXED PATTERN NOISE CALCULATION PROGRAM

(71) Applicant: FUJIFILM Corporation, Tokyo (JP)

(72) Inventor: Makoto Kobayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 82 days.

(21) Appl. No.: 15/440,222

(22) Filed: Feb. 23, 2017

(65) Prior Publication Data

US 2017/0163884 A1 Jun. 8, 2017

Related U.S. Application Data

(63) Continuation of application No. PCT/JP2015/063800, filed on May 13, 2015.

(30) Foreign Application Priority Data

Sep. 30, 2014 (JP) .................. 2014-200077

(51) Int. Cl.
 *G01J 1/12* (2006.01)
 *G01J 1/26* (2006.01)
 (Continued)

(52) U.S. Cl.
 CPC ............ *H04N 5/23222* (2013.01); *G01J 1/26* (2013.01); *G01J 1/44* (2013.01); *H04N 5/33* (2013.01)

(58) Field of Classification Search
 CPC ............ H04N 5/23222; H04N 5/3651; H04N 5/23232; H04N 5/33; H01L 27/14; G01J 1/42; G01J 1/26; G01J 1/12; G01J 1/44
 See application file for complete search history.

(56) References Cited

U.S. PATENT DOCUMENTS

| 5,903,659 | A | 5/1999 | Kilgore | |
|---|---|---|---|---|
| 2002/0191100 | A1* | 12/2002 | Matsunaga | H04N 5/23212 348/345 |
| 2011/0001830 | A1* | 1/2011 | Egashira | G01J 5/08 348/164 |

FOREIGN PATENT DOCUMENTS

| CN | 102663714 A | 9/2012 |
|---|---|---|
| JP | 2-190083 A | 7/1990 |

(Continued)

OTHER PUBLICATIONS

"Generalized algebraic algorithm for scene-based nonuniformity correction"; Majeed M. Hayat, Bradley M. Ratliff, J. Scott Tyo, Kamil Agi; Proceedings of SPIE ; (Year: 2004).*

(Continued)

*Primary Examiner* — Jared Walker
(74) *Attorney, Agent, or Firm* — Birch, Stewart, Kolasch & Birch, LLP

(57) ABSTRACT

An infrared imaging device includes an imaging element including a plurality of infrared detection pixels which are two-dimensionally arranged, a diaphragm, and a FPN calculation unit which acquires a first captured image data obtained by capturing an image using the imaging element in a state in which an F-number of the diaphragm is set to a first value and a second captured image data obtained by capturing an image using the imaging element in a state in which the F-number is set to a second value while a motion picture is being captured, and calculates fixed pattern noise included in captured image data obtained by capturing an image using the imaging element based on the acquired first captured image data, the acquired second captured image data, the first value, and the second value.

19 Claims, 9 Drawing Sheets

(51) Int. Cl.
*G01J 1/42* (2006.01)
*H04N 5/33* (2006.01)
*H04N 5/365* (2011.01)
*G01J 5/06* (2006.01)
*G01J 5/08* (2006.01)
*G01J 1/44* (2006.01)
*H04N 5/232* (2006.01)

(56) References Cited

FOREIGN PATENT DOCUMENTS

| | | |
|---|---|---|
| JP | 10-115557 A | 5/1998 |
| JP | 2001-336983 A | 12/2001 |
| JP | 2001-509996 A | 12/2001 |
| JP | 2009-089138 A | 4/2009 |
| JP | 2009-207072 A | 9/2009 |

OTHER PUBLICATIONS

International Search Report (PCT/ISA/210) issued in PCT/JP2015/063800, dated Aug. 11, 2015.
Written Opinion (PCT/ISA/237) issued in PCT/JP2015/063800, dated Aug. 11, 2015.
English translation of Written Opinion of the International Searching Authority issued in PCT/JP2015/063800 dated Aug. 11, 2015 (Form PCT/ISA/237).
Chinese Office Action and Search Report, dated Jan. 3, 2019, for corresponding Chinese Application No. 201580052995.9, with an English translation of the Office Action.
Chinese Office Action, dated Aug. 9, 2019, for corresponding Chinese Application No. 201580052995.9, with an English translation.

* cited by examiner

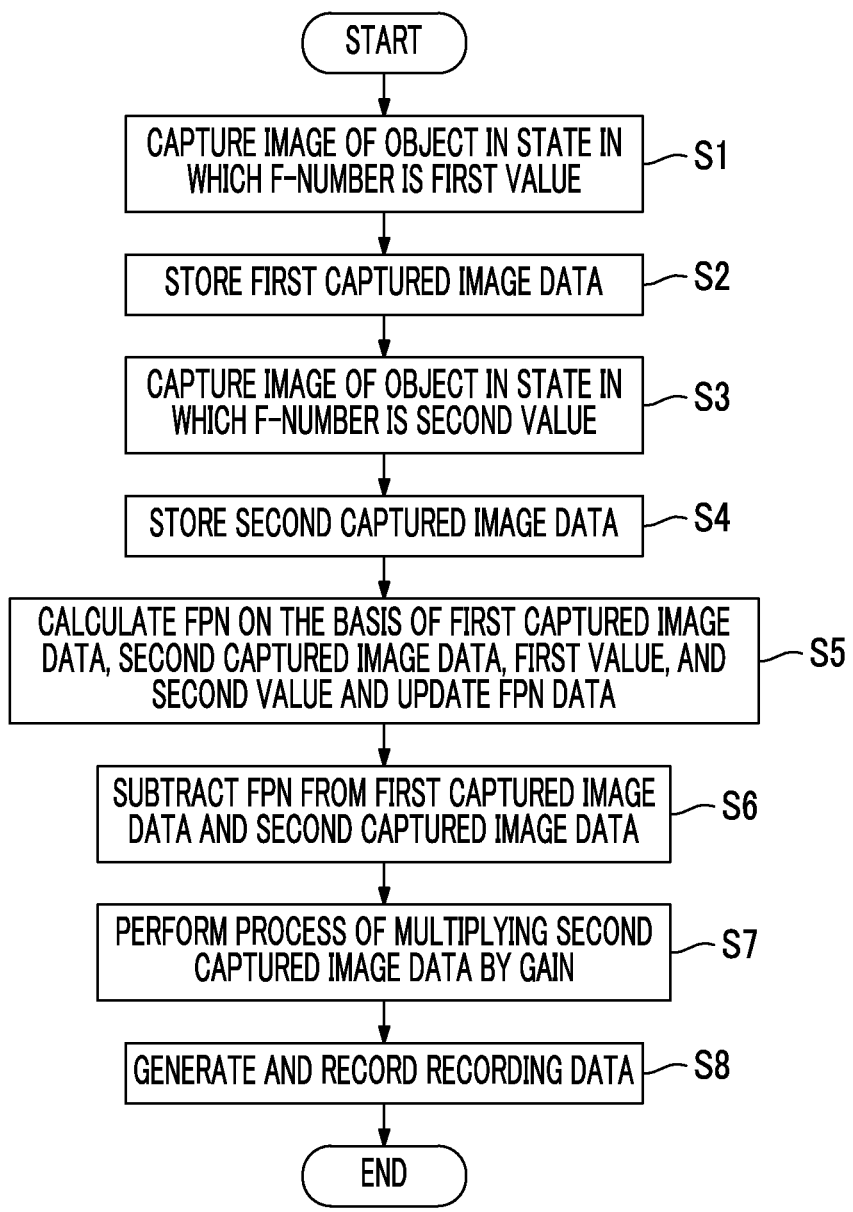

INFRARED IMAGING DEVICE, FIXED PATTERN NOISE CALCULATION METHOD, AND FIXED PATTERN NOISE CALCULATION PROGRAM

CROSS REFERENCE TO RELATED APPLICATION

This is a continuation of International Application No. PCT/JP2015/063800 filed on May 13, 2015, and claims priority from Japanese Patent Application No. 2014-200077 filed on Sep. 30, 2014, the entire disclosures of which are incorporated herein by reference.

BACKGROUND OF THE INVENTION

1. Field of the Invention

The present invention relates to an infrared imaging device, a fixed pattern noise calculation method, and a computer readable medium storing a fixed pattern noise calculation program.

2. Description of the Related Art

In the related art, in an infrared imaging device, intrinsic fixed pattern noise (hereinafter, it is abbreviated as FPN) of devices such as a variation in sensitivity of an infrared detection pixel and a variation in gain and offset of a circuit is generated. In particular, in an infrared imaging device having imaging elements in which infrared detection pixels are two-dimensionally arranged, characteristics of each infrared detection pixel fluctuate, and thus FPN which is changed for a relatively long time is generated.

When such FPN is generated in the infrared imaging device, even in case where images of surfaces having a uniform temperature are captured, a captured image having uniform brightness (density) cannot be obtained. For the reason, in the infrared imaging device, shutter is provide in the device, FPN is calculated in a state where light incident to an infrared detection pixel from the outside is blocked, and FPN is corrected (for example, see JP2009-089138A and JP1998-115557A (JP-H10-115557A)).

However, in a method of calculating FPN in a state where a shutter is closed, the shutter is periodically closed during an operation of the infrared imaging device. Therefore, while a motion picture is being captured, the motion picture captured is periodically interrupted.

For the reason, a method of calculating FPN without using a shutter is proposed (for example, see JP2001-509996A and JP2001-336983A).

JP2001-509996A discloses technique of calculating FPN using a captured image obtained in a focused state and a captured image obtained in a non-focused state.

JP2001-336983A discloses technique of calculating FPN using a captured image obtained when an optical system is in a defocused state.

SUMMARY OF THE INVENTION

In the methods described in JP2001-509996A and JP2001-336983A, while a motion picture is being captured, a blurred captured image is periodically generated in order to calculate FPN, and the quality of a motion picture is deteriorated.

The invention has been made in view of the above-mentioned problems and an object of the invention is to provide an infrared imaging device, a fixed pattern noise calculation method, and a computer readable medium storing a fixed pattern noise calculation program, which are capable of calculating FPN with high accuracy without interrupting the capture of motion pictures with high quality.

An infrared imaging device according to the invention comprises: an imaging element including a plurality of infrared detection pixels which are two-dimensionally arranged; a diaphragm that is provided closer to an object than the imaging element; and a fixed pattern noise calculation unit that acquires a first captured image data obtained by capturing an image using the imaging element in a state in which an F-number of the diaphragm is set to a first value and a second captured image data obtained by capturing an image using the imaging element in a state in which the F-number of the diaphragm is set to a second value while a motion picture is being captured, and calculates fixed pattern noise included in captured image data obtained by capturing an image using the imaging element on the basis of the acquired first captured image data, the acquired second captured image data, the first value and the second value.

A fixed pattern noise calculation method according to the invention is performed by an infrared imaging device including an imaging element including a plurality of infrared detection pixels which are two-dimensionally arranged and a diaphragm that is provided closer to an object than the imaging element. The fixed pattern noise calculation method comprises a fixed pattern noise calculation step of acquiring a first captured image data obtained by capturing an image using the imaging element in a state in which an F-number of the diaphragm is set to a first value and a second captured image data obtained by capturing an image using the imaging element in a state in which the F-number of the diaphragm is set to a second value while a motion picture is being captured, and calculating fixed pattern noise included in captured image data obtained by capturing an image using the imaging element on the basis of the acquired first captured image data, the acquired second captured image data, the first value and the second value.

A fixed pattern noise calculation program according to the invention causes an infrared imaging device including an imaging element including a plurality of infrared detection pixels which are two-dimensionally arranged and a diaphragm that is provided closer to an object than the imaging element to perform a fixed pattern noise calculation step of acquiring a first captured image data obtained by capturing an image using the imaging element in a state in which an F-number of the diaphragm is set to a first value and a second captured image data obtained by capturing an image using the imaging element in a state in which the F-number of the diaphragm is set to a second value while a motion picture is being captured, and calculating fixed pattern noise included in captured image data obtained by capturing an image using the imaging element on the basis of the acquired first captured image data, the acquired second captured image data, the first value, and the second value.

According to the invention, it is possible to provide an infrared imaging device, a fixed pattern noise calculation method, and a fixed pattern noise calculation program, which are capable of calculating FPN with high accuracy without interrupting the capture of motion pictures with high quality.

BRIEF DESCRIPTION OF THE DRAWINGS

FIG. 4 is a flowchart illustrating an FPN calculation operation of the infrared imaging device illustrated in FIG. 1.

FIG. 11 is a diagram illustrating a calculation coefficient a.

DESCRIPTION OF THE PREFERRED EMBODIMENTS

Hereinafter, an embodiment of the invention will be described with reference to the drawings.

Figure 1:
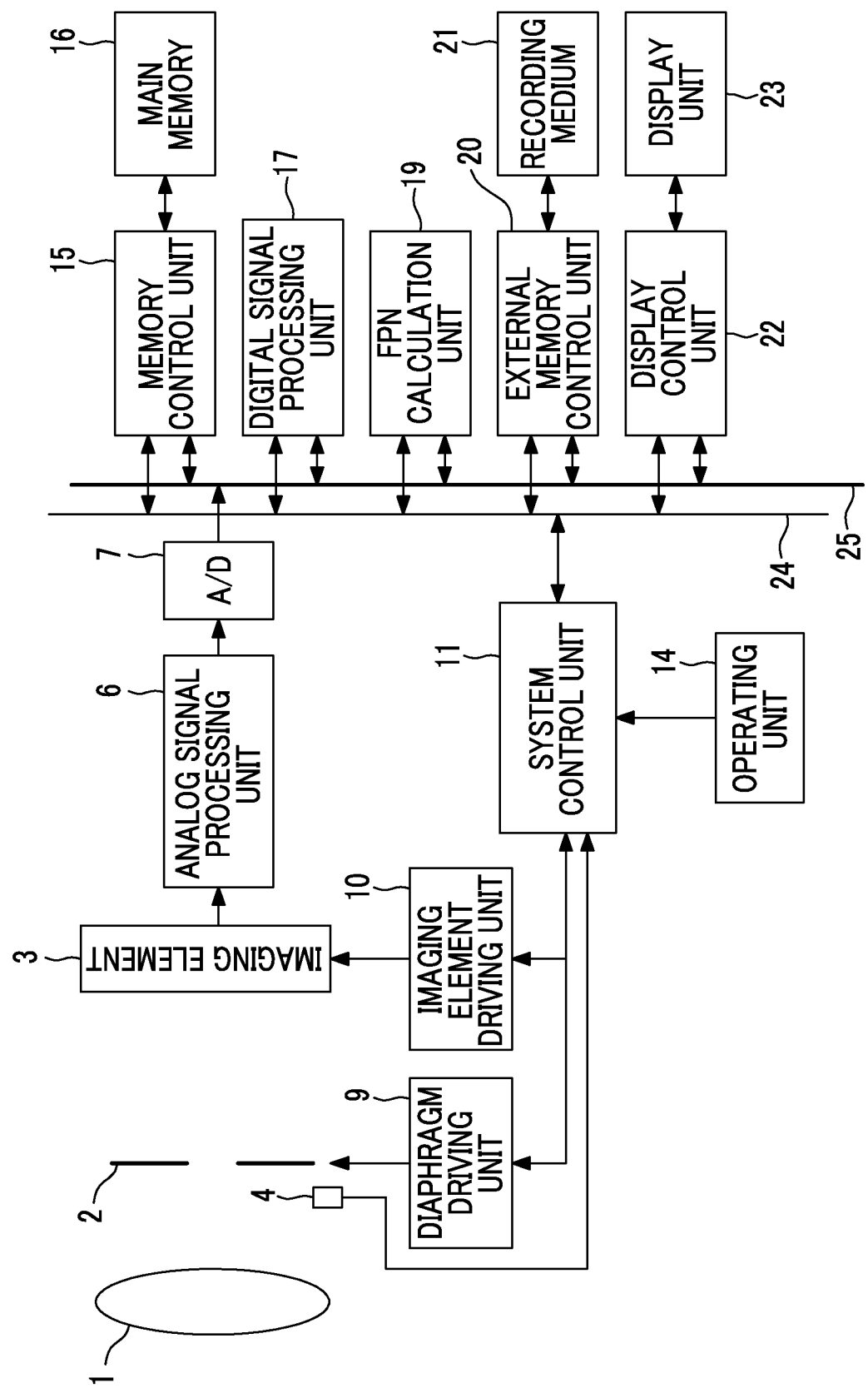
FIG. 1 is a diagram schematically illustrating the structure of an infrared imaging device for describing an embodiment of the invention.

FIG. 1 is a diagram schematically illustrating the structure of an infrared imaging device for describing an embodiment of the invention.

The infrared imaging device illustrated in FIG. 1 comprises an imaging lens 1, a diaphragm 2, an imaging element 3 that captures an image of an object through the imaging lens 1 and the diaphragm 2, a temperature detection unit 4 that detects the temperature of the diaphragm 2, an analog signal processing unit 6, an analog/digital conversion circuit (A/D conversion circuit) 7, a diaphragm driving unit 9, and an imaging element driving unit 10.

The imaging element 3 includes a plurality of infrared detection pixels which are two-dimensionally arranged and detect infrared rays (in general, light with a wavelength of 8 μm to 12 μm) that have been radiated from the object and focused through the imaging lens 1 and the diaphragm 2. The imaging element 3 is driven by the imaging element driving unit 10.

A pyroelectric element is given as an example of an infrared detection element used in the infrared detection pixel. Alternatively, a thermopile-type infrared detection element in which thermocouples generating the Seebeck effect are connected or a bolometer-type infrared detection element using a change in a resistance value caused by a temperature rise may be used.

The infrared detection element is not limited to the above and any type of infrared detection element may be used as long as it can detect infrared rays. In the specification, a set of pixel signals output from all of the infrared detection pixels of the imaging element 3 is referred to as captured image data.

The diaphragm 2 is provided closer to the object than the imaging element 3 and the opening area of the diaphragm 2 is controlled by the diaphragm driving unit 9.

The temperature detection unit 4 is a temperature sensor, such as a thermistor, is provided in the vicinity of the diaphragm 2, and notifies a system control unit 11 of the detected temperature.

The analog signal processing unit 6 performs analog signal processing including an amplification process of multiplying each pixel signal value of the captured image data output from the imaging element 3 by the gain to amplify the captured image data.

The A/D conversion circuit 7 converts the analog captured image data output from the analog signal processing unit 6 into digital data.

The analog signal processing unit 6, the A/D conversion circuit 7, the diaphragm driving unit 9, and the imaging element driving unit 10 are controlled by the system control unit 11.

A command signal is input from the user to the system control unit 11 through an operating unit 14.

In addition, an electric control system of the infrared imaging device comprises a main memory 16, a memory control unit 15 connected to the main memory 16, a digital signal processing unit 17 that performs, for example, a process of converting the captured image data output from the A/D conversion circuit 7 into a format which can be displayed by a display unit 23, an FPN calculation unit 19 that calculates FPN included in the captured image data obtained by capturing an image using the imaging element 3, an external memory control unit 20 to which a detachable recording medium 21 is connected, and a display control unit 22 to which the display unit 23 is connected.

The memory control unit 15, the digital signal processing unit 17, the FPN calculation unit 19, the external memory control unit 20, and the display control unit 22 are connected to each other by a control bus 24 and a data bus 25 and are controlled by instructions from the system control unit 11.

The FPN calculation unit 19 calculates FPN included in the captured image data obtained by capturing the image of the object using the imaging element 3, on the basis of first captured image data obtained by capturing the image of the object using the imaging element 3 in a state in which the F-number of the diaphragm 2 is set to a first value, second captured image data obtained by capturing the image of the object using the imaging element 3 in a state in which the F-number of the diaphragm 2 is set to a second value, the first value, and the second value.

Figure 2:
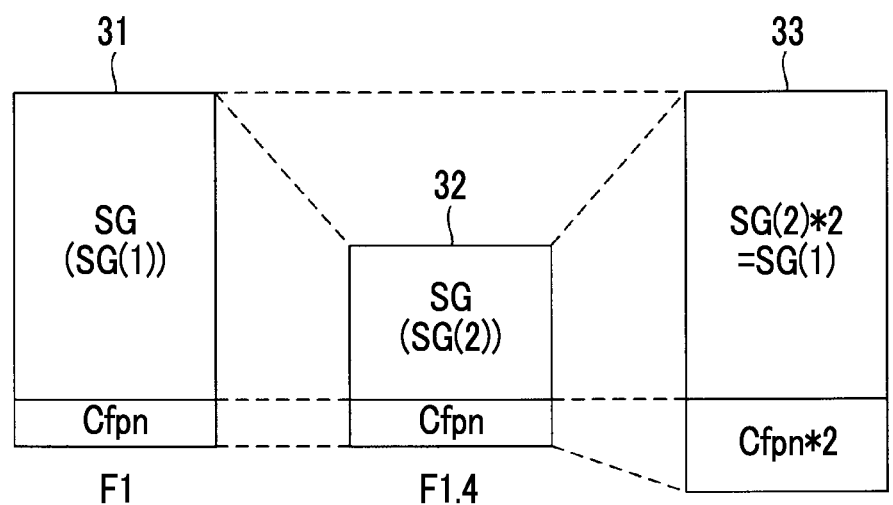
FIG. 2 is a diagram illustrating an FPN calculation method using two captured image data items obtained by capturing image while the F-number is changed to F1 and F1.4.

FIG. 2 is a diagram illustrating an FPN calculation method in a case in which the first value is F1 and the second value is F1.4.

In FIG. 2, reference numeral 31 indicates a pixel signal value at an arbitrary coordinate position in the first captured image data obtained in a state in which the F-number=F1 is established. Reference numeral 32 indicates a pixel signal value at the arbitrary coordinate position in the second captured image data obtained in a state in which the F-number=F1.4 is established.

As illustrated in FIG. 2, each pixel signal value 31 of the first captured image data and each pixel signal value 32 of the second captured image data include an FPN component $C_{fpn}$ and a signal component SG other than the FPN component $C_{fpn}$.

Here, the first captured image data and the second captured image data are acquired at a short time interval (for example, the first captured image data and the second captured image data are continuously captured). Therefore, the FPN components $C_{fpn}$ included in each pixel signal value 31 of the first captured image data and each pixel signal value 32 of the second captured image data can be considered to have the same value.

Figure 3:
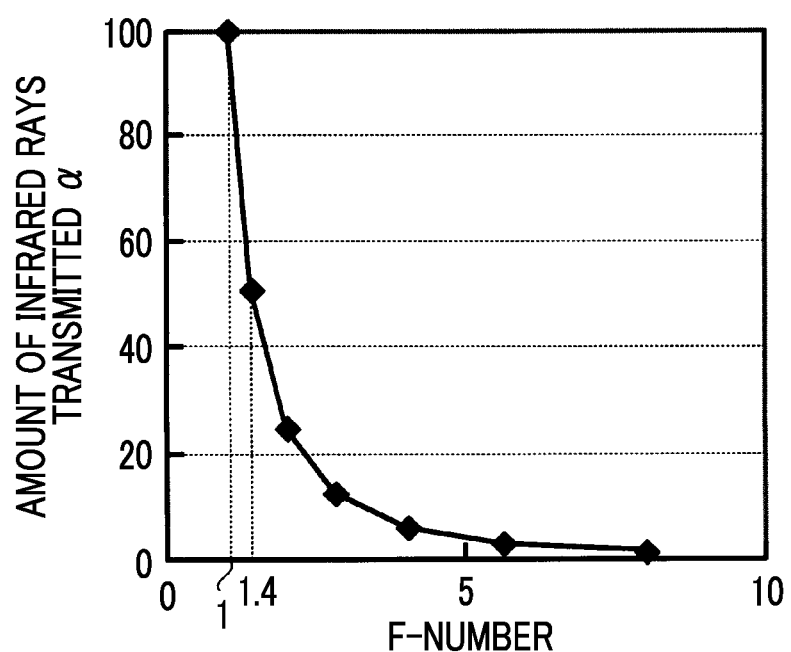
FIG. 3 is a diagram illustrating the relationship between the F-number and infrared transmittance α indicating the amount of infrared rays transmitted through a diaphragm 2.

FIG. 3 is a diagram illustrating the relationship between the F-number and infrared transmittance α indicating the amount of infrared rays transmitted through the diaphragm 2. In FIG. 3, the infrared transmittance α through the diaphragm 2 when the F-number=F1 is established (a state in which the opening area of the diaphragm 2 is the maximum) is standardized to "100%".

As illustrated in FIG. 3, when the F-number=F1.4 is established, the amount of infrared rays incident on the imaging element 3 is half of the amount of infrared rays incident on the imaging element 3 when the F-number=F1 is established.

That is, a signal component SG (hereinafter, also represented by SG(2)) included in each pixel signal value 32 of the second captured image data illustrated in FIG. 2 is a value obtained by multiplying a signal component SG (hereinafter, also represented by SG(1)) included in each pixel signal value 31 of the first captured image data by the ratio (=0.5) of the infrared transmittance α at an F-number of F1.4 to the infrared transmittance α at an F-number of F1.

As such, the ratio of the signal component SG(1) included in the pixel signal value 31 to the signal component SG(2) included in the pixel signal value 32 is uniquely determined from the difference between the F-number when the pixel signal value 31 is obtained and the F-number when the pixel signal value 32 is obtained.

The FPN calculation unit 19 sets a coefficient for making the value of the signal component SG(2) and the value of the signal component SG(1) equal to each other, on the basis of the ratio (=0.5) of the infrared transmittance α at an F-number of F1.4 to the infrared transmittance α at an F-number of F1, and multiplies at least one of the pixel signal value 31 or the pixel signal value 32 by the set coefficient.

For example, in a case in which only the pixel signal value 31 is multiplied by the coefficient, the ratio (=0.5) of the infrared transmittance α at an F-number of F1.4 to the infrared transmittance α at an F-number of F1 is set as the coefficient.

In a case in which only the pixel signal value 32 is multiplied by the coefficient, the reciprocal (=2) of the ratio (=0.5) of the infrared transmittance α at an F-number of F1.4 to the infrared transmittance α at an F-number of F1 is set as the coefficient.

In a case in which each of the pixel signal value 31 and the pixel signal value 32 is multiplied by the coefficients, the coefficients are set such that the ratio of the coefficients by which each pixel signal value is multiplied is equal to the ratio (=0.5) of the infrared transmittance α at an F-number of F1.4 to the infrared transmittance α at an F-number of F1.

For example, the coefficient by which the pixel signal value 31 is multiplied is set to "1.5" and the coefficient by which the pixel signal value 32 is multiplied is set to "3".

FIG. 2 illustrates a pixel signal value 33 obtained by multiplying the pixel signal value 32 by a coefficient (=2). The multiplication of the coefficients makes the signal component SG of the pixel signal value 31 and the signal component SG of the pixel signal value 33 have the same value.

Therefore, after multiplying the coefficients, the FPN calculation unit 19 can subtract the pixel signal value 31 from the pixel signal value 33 to calculate the FPN component $C_{fpn}$.

In a case in which only the pixel signal value 31 is multiplied by the coefficient, a pixel signal value obtained by multiplying the pixel signal value 31 by 0.5 can be subtracted from the pixel signal value 32 and a pixel signal value after the subtraction can be multiplied by 2 to calculate the FPN component $C_{fpn}$.

In a case in which each of the pixel signal value 31 and the pixel signal value 32 is multiplied by the coefficients, a pixel signal value obtained by multiplying the pixel signal value 31 by 1.5 can be subtracted from a pixel signal value obtained by multiplying the pixel signal value 32 by 3 and a pixel signal value after the subtraction can be divided by 1.5 to calculate the FPN component $C_{fpn}$.

FIG. 4 is a flowchart illustrating the FPN calculation operation of the infrared imaging device illustrated in FIG. 1.

For example, the process illustrated in FIG. 4 is performed at a predetermined interval (for example, once every ten seconds) in a video imaging mode in which infrared images obtained by capturing the object a plurality of times using the imaging element 3 are displayed on the display unit 23.

In the video imaging mode, it is assumed that the F-number of the diaphragm 2 is set to the first value in advance by, for example, a manual operation when the capture of a motion picture starts.

First, when the capture of a motion picture starts, the digital signal processing unit 17 processes the captured image data which is output from the imaging element 3 at a predetermined interval to generate recording data. The recording data is recorded in the recording medium 21 and an infrared image based on the recording data is displayed on the display unit 23.

The processes which are performed for the captured image data by the digital signal processing unit 17 include a process of subtracting the FPN component $C_{fpn}$ recorded in an FPN recording region of the main memory 16 from the captured image data to correct FPN.

When the capture of a motion picture starts, the FPN component $C_{fpn}$ is not recorded in the FPN recording region of the main memory 16. Therefore, when the infrared imaging device is set to the video imaging mode, first, the infrared imaging device performs the following process.

The system control unit 11 maintains the F-number of the diaphragm 2 at the first value which is set as imaging conditions. In this state, the system control unit 11 directs the imaging element 3 to capture an image (Step S1). The first captured image data obtained by the imaging operation is output from the imaging element 3 and is temporarily stored in the main memory 16 (Step S2).

Then, the system control unit 11 changes the F-number of the diaphragm 2 from the first value to the second value. In this state, the system control unit 11 directs the imaging element 3 to capture an image (Step S3). The second captured image data obtained by the imaging operation is output from the imaging element 3 and is temporarily stored in the main memory 16 (Step S4).

Then, the FPN calculation unit 19 acquires the first captured image data and the second captured image data temporarily stored in the main memory 16 and calculates the FPN component $C_{fpn}$ on the basis of the acquired first captured image data, the acquired second captured image data, the first value which is the F-number when the first captured image data is acquired, and the second value which is the F-number when the second captured image data is acquired (Step S5).

When calculating the FPN component $C_{fpn}$, the FPN calculation unit 19 records the FPN component $C_{fpn}$ in the FPN recording region of the main memory 16.

Then, the digital signal processing unit 17 subtracts the FPN component $C_{fpn}$ generated in Step S5 from each of the first captured image data and the second captured image data temporarily stored in the main memory 16 to correct FPN (Step S6).

Then, the digital signal processing unit 17 performs a process of multiplying the second captured image data having the corrected FPN by the gain such that the difference between the brightness of the second captured image data having the corrected FPN and the brightness of the first captured image data having the corrected FPN is reduced (Step S7).

Specifically, the digital signal processing unit 17 multiplies the second captured image data having the corrected FPN by the gain corresponding to the difference between the second value and the first value. The digital signal processing unit 17 functions as a gain processing unit.

For example, when the first value is F1 and the second value is F1.4, the gain is 2 on the basis of the difference between the infrared transmittances α at F1 and F1.4 illustrated in FIG. 2 and the digital signal processing unit 17 multiplies each pixel signal value of the second captured image data by 2.

When the first value is F2 and the second value is F1.4, the gain is 0.5 on the basis of the difference between the infrared transmittances α at F2 and F1.4 illustrated in FIG. 2 and the digital signal processing unit 17 multiplies each pixel signal value of the second captured image data by 0.5.

After Step S7, the digital signal processing unit 17 generates recording data from the first captured image data and the second captured image data processed in Steps S6 and S7 and records the recording data in the recording medium 21 (Step S8).

After Step S8, the system control unit 11 returns the F-number from the second value to the first value and continues to capture motion pictures.

As described above, according to the infrared imaging device illustrated in FIG. 1, it is possible to calculate FPN with high accuracy, without interrupting the capture of motion pictures. In addition, a blurred image is not periodically generated while a motion picture is being captured, unlike the related art. Therefore, it is possible to capture high-quality motion pictures.

Furthermore, FPN can be calculated only by an operation of instantaneously closing or opening the diaphragm 2 while a motion picture is being captured, without closing a shutter or without generating a defocused state. Therefore, it is possible to reduce the power required to calculate FPN.

According to the infrared imaging device illustrated in FIG. 1, since the brightness of the second captured image data is corrected by the gain, the brightness of the recording data which is recorded in the recording medium while a motion picture is being captured is uniform. In addition, the brightness of the image which is displayed on the display unit 23 while a motion picture is being captured is uniform. Therefore, there is no variation in image quality due to a change in the F-number of the diaphragm 2 while a motion picture is being captured and it is possible to maintain the quality of a motion picture.

When the F-number of the diaphragm is changed while a motion picture is being captured, the depth of field is likely to vary. In an imaging device that is mainly used to see an image and captures a visible light image, image quality varies significantly with a change in the depth of field. As a result, the user who sees a motion picture feels discomfort.

However, in the infrared imaging device, for example, in a case in which an image of an object in the plane is captured, a variation in image quality caused by a change in the depth of field can be allowed.

As such, in the infrared imaging device, there is a scene in which a change in the depth of field can be allowed while a motion picture is being captured. Therefore, the above-mentioned FPN calculation method is effective in the infrared imaging device.

The above-mentioned FNP calculation method calculates FPN on the basis of two captured image data items which are acquired while the F-number is changed. Therefore, when there is a difference in content between the two captured image data items, it is difficult to accurately calculate FPN.

For this reason, after Step S4 in FIG. 4, the FPN calculation unit 19 compares the first captured image data with the second captured image data and determines whether a moving body portion is present in the two captured image data items, using a known moving body detection process. The FPN calculation unit 19 functions as a moving body determination unit.

In a case in which it is determined that a moving body portion is present, the FPN calculation unit 19 determines that the accuracy of calculating FPN is low and does not perform the process in Step S5.

Then, in Step S6, the digital signal processing unit 17 performs FPN correction for the first captured image data and the second captured image data, using the FPN stored in the main memory 16 and the process proceeds to Step S7.

In this way, it is possible to prevent the FPN stored in the main memory 16 from being updated with a low-accuracy value and to improve the quality of a motion picture.

The FPN calculation unit 19 may perform the FPN calculation process when a variation in the temperature detected by the temperature detection unit 4 is equal to or greater than a threshold value. Since a large variation in the temperature is considered as a large change in FPN, this timing is effective.

In a case in which the FPN calculated by the FPN calculation unit 19 is equal to or greater than a threshold value, it is preferable that the system control unit 11 stops continuous shooting and cools the imaging element 3. In this case, it is possible to prevent the deterioration of image quality.

The infrared imaging device illustrated in FIG. 1 comprises the diaphragm 2. Therefore, the infrared rays which are incident on the imaging element 3 include infrared rays radiated from a diaphragm blade of the diaphragm 2.

In the above description, the FPN calculation unit 19 calculates FPN, without considering the infrared rays radiated from the diaphragm blade. Next, a method for calculating FPN, considering the infrared rays radiated from the diaphragm blade, in order to further improve the accuracy of calculating FPN will be described.

Figures 5A, 5B, 5C:
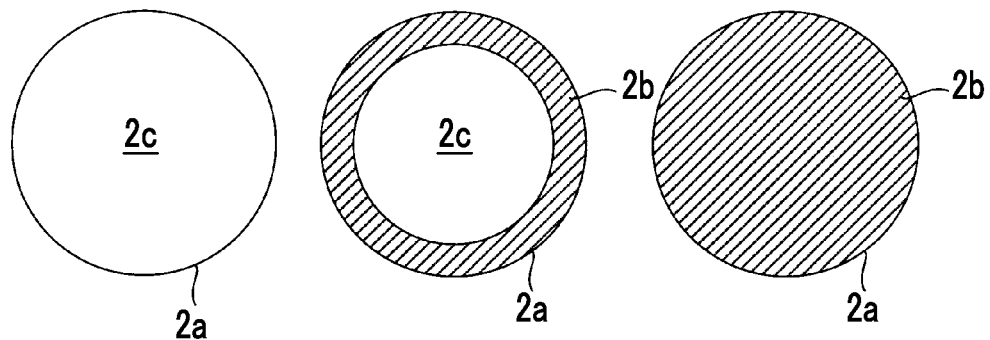
FIGS. 5A, 5B, and 5C are diagrams illustrating the diaphragm 2 as viewed from an imaging element 3.

FIGS. 5A, 5B, and 5C are diagrams illustrating the diaphragm 2 as viewed from the imaging element 3. FIG. 5A illustrates the state of the diaphragm 2 when the F-number=F1 is established, FIG. 5B illustrates the state of the diaphragm 2 when the F-number=F1.4 is established, and FIG. 5C illustrates the state of the diaphragm 2 in a state in which the diaphragm 2 is fully closed (F-number=F∞). In FIGS. 5A, 5B, and 5C, reference numeral 2a indicates an overlap portion between the imaging range of the imaging element 3 and the outer circumference of the diaphragm blade, reference numeral 2b indicates the surface of the diaphragm blade, and reference numeral 2c indicates the opening of the diaphragm 2.

As illustrated in FIGS. 5A, 5B, and 5C in which the diaphragm 2 is viewed from the imaging element 3, when the F-number of the diaphragm 2 varies, the exposure area of the diaphragm blade varies. For example, the comparison between the F-number=F∞ and the F-number=F1.4 shows that the exposure area of the diaphragm blade when the F-number=F1.4 is established is about half of the exposure area of the diaphragm blade when the F-number=F∞ is established. The exposure area of the diaphragm blade means the area of a portion of the diaphragm blade which is not shielded by an obstacle that blocks infrared rays, as viewed from the imaging element 3.

Infrared rays are radiated from an exposed portion of the diaphragm blade and are then incident on the imaging element 3. Therefore, it is preferable that the ratio of the signal component SG(1) of the first captured image data obtained at an F-number of F1 to the signal component SG(2) of the second captured image data obtained at an F-number of F1.4 is calculated considering the amount of infrared rays radiated from the diaphragm 2.

Figure 6:
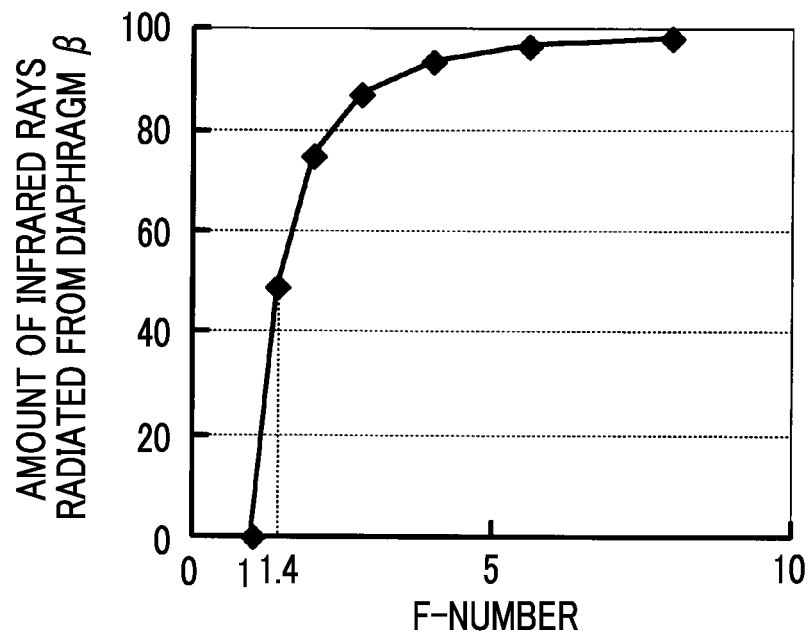
FIG. 6 is a diagram illustrating the relationship between the F-number and the amount of infrared rays radiated from the diaphragm 2.

FIG. 6 is a diagram illustrating the relationship between the F-number and the amount of infrared rays radiated from the diaphragm 2. In FIG. 6, the amount of infrared rays β which are radiated from the diaphragm 2 when the F-number=F1 is established is standardized to "0" and the amount of infrared rays which are radiated from the diaphragm 2 when the F-number=F∞ is established is standardized to "100".

As illustrated in FIG. 6, the amount of infrared rays β which are radiated from the diaphragm 2 when the F-number=F1.4 is established is about half of the amount of infrared rays which are radiated from the diaphragm 2 when the F-number=F∞ is established. Data illustrated in FIG. 6 varies depending on the temperature of the diaphragm 2. Therefore, the data illustrated in FIG. 6 is stored for each temperature of the diaphragm 2 in the main memory 16.

The pixel signal values which are output from each infrared detection pixel of the imaging element 3 are different from each other according to the amount of infrared rays radiated from the diaphragm 2 and vary depending on a position on a light receiving surface of the infrared detection pixel.

For example, a pixel signal value which is output from an infrared detection pixel at a position opposite to an opening portion of the diaphragm 2 is small and a pixel signal value which is output from an infrared detection pixel at a position opposite to the diaphragm blade of the diaphragm 2 is large.

A table data in which a pixel signal value that is output from each infrared detection pixel according to the infrared rays radiated from the diaphragm 2 is recorded for each settable F-number of the infrared imaging device illustrated in FIG. 1 in advance.

In addition, a plurality of table data items corresponding to an arbitrary F-number are stored for each temperature of the diaphragm 2. The reason is that, when the temperature of the diaphragm 2 varies, the amount of infrared rays radiated from the diaphragm 2 varies even if the exposure area of the diaphragm blade is the same.

For example, a signal value corresponding to the temperature of the object of which the temperature is known and which has a uniform temperature distribution is subtracted from each pixel signal value of the captured image data obtained by capturing the image of the object using the imaging element 3 to calculate a pixel signal value corresponding to the infrared rays radiated from the diaphragm 2 for each infrared detection pixel.

This operation can be repeated while the F-number is changed to calculate the table data. In addition, the operation can be repeated at a fixed F-number while the temperature of the diaphragm 2 is changed to generate a plurality of table data items for the same F-number.

The pixel signal value that is output from each infrared detection pixel according to the infrared rays radiated from the diaphragm 2 is proportional to the product of the fourth power of the temperature of the diaphragm 2 and the exposure area of the diaphragm 2.

Therefore, the pixel signal value that is output from each infrared detection pixel according to the infrared rays radiated from the diaphragm 2 can be calculated for an arbitrary F-number (a value other than the minimum value) and can be corrected on the basis of the temperature and F-number of the diaphragm 2 to create the table data.

Figure 7:
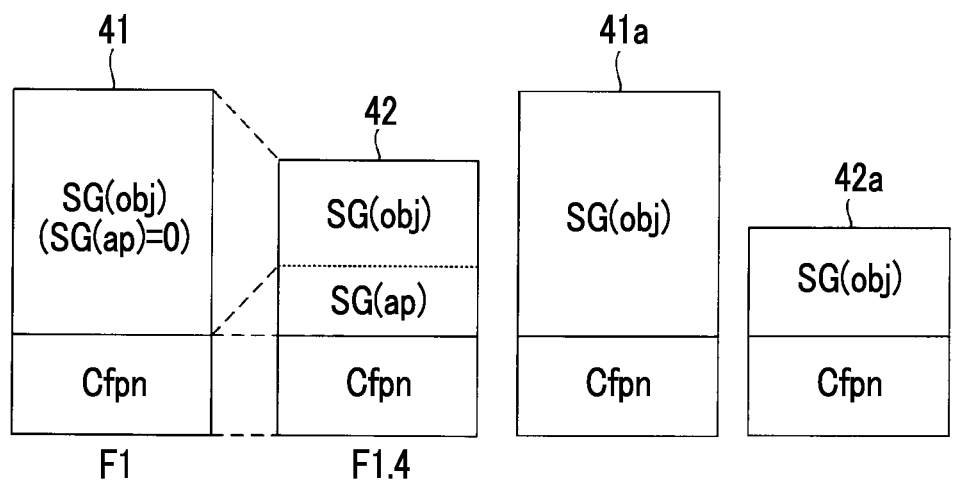
FIG. 7 is a diagram illustrating a modification example of the FPN calculation method.

FIG. 7 is a diagram illustrating a modification example of the FPN calculation method.

FIG. 7 illustrates a pixel signal value 41 at an arbitrary coordinate position of the first captured image data obtained in a state in which the F-number=F1 is established and a pixel signal value 42 at the arbitrary coordinate position of the second captured image data obtained in a state in which the F-number=F1.4 is established.

A signal component SG included in each of the pixel signal value 41 and the pixel signal value 42 includes a signal component SG(obj) corresponding to infrared rays radiated from the object and a signal component SG(ap) corresponding to infrared rays radiated from the diaphragm 2. In a case in which the F-number=F1 is established, the exposure area of the diaphragm 2 is "0". Therefore, the signal component SG(ap) of the pixel signal value 41 is "0".

The ratio of the signal component SG(obj) of the pixel signal value 42 to the signal component SG(obj) of the pixel signal value 41 is determined by the ratio of the infrared transmittance α at F1 to the infrared transmittance α at F1.4 and is about "0.5". In addition, the signal component SG(ap) of the pixel signal value 41 and the signal component SG(ap) of the pixel signal value 42 are known values in the table data.

The FPN calculation unit 19 searches for the signal component SG(ap) of the pixel signal value 41 from the table data corresponding to a combination of the temperature of the diaphragm 2 detected by the temperature detection unit 4 and the F-number=F1 and acquires the signal component SG(ap).

In addition, the FPN calculation unit 19 searches for the signal component SG(ap) of the pixel signal value 42 from the table data corresponding to a combination of the temperature of the diaphragm 2 detected by the temperature detection unit 4 and the F-number=F1.4 and acquires the signal component SG(ap).

Then, the FPN calculation unit 19 sets a coefficient for making a pixel signal value 41a obtained by subtracting the acquired signal component SG(ap) from the pixel signal value 41 equal to a pixel signal value 42*a* obtained by subtracting the acquired signal component SG(ap) from the pixel signal value 42.

Then, the FPN calculation unit 19 multiplies at least one of the pixel signal value 41*a* or the pixel signal value 42*a* by the set coefficient. A process after the multiplication is the same as that described in FIG. 2.

As described above, FPN is calculated, considering a change in the amount of infrared rays radiated from the diaphragm 2 due to a change in the F-number. Therefore, it is possible to calculate FPN with high accuracy and to improve image quality.

In this embodiment, detection sensitivity indicating a pixel signal value which is output from the infrared detection pixel with respect to the same amount of infrared rays is the same at any position on the light receiving surface of the imaging element 3. However, in practice, the detection sensitivity of the infrared detection pixel varies depending on a position on the light receiving surface of the infrared detection pixel and shading occurs in the captured image data.

Figure 8:
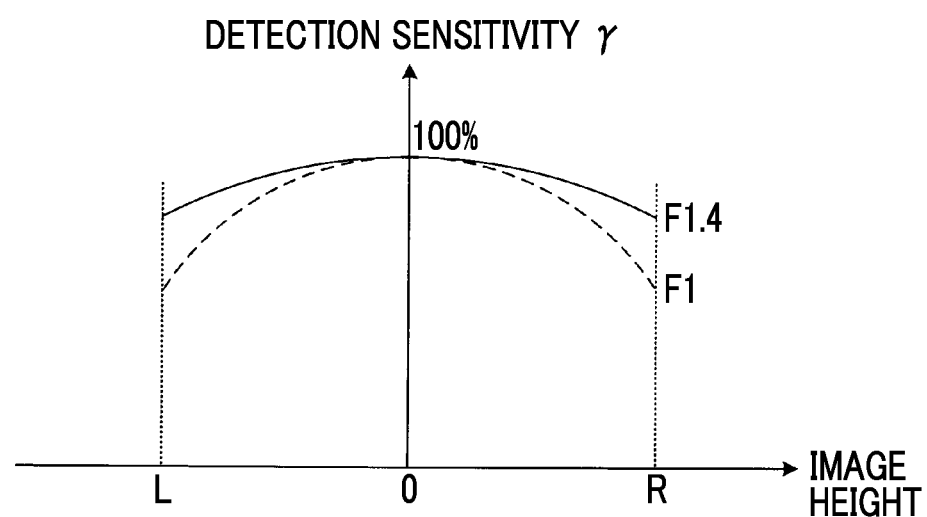
FIG. 8 is a diagram illustrating the detection sensitivity of each infrared detection pixel when the imaging element 3 captures an image of an object with a uniform temperature.

FIG. 8 is a diagram illustrating the detection sensitivity γ of each infrared detection pixel when the imaging element 3 captures an image of an object with a uniform temperature. In FIG. 8, the horizontal axis indicates a position on the light receiving surface in one direction and a position where the horizontal axis intersects the optical axis of the imaging optical system is represented by 0.

"R" indicates the position of an infrared detection pixel located at one end among the infrared detection pixels on a straight line that is set on the light receiving surface of the imaging element 3 and passes through an infrared detection pixel at the position "0". "L" indicates the position of an infrared detection pixel located at the other end among the infrared detection pixels on the straight line.

In FIG. 8, the detection sensitivity γ when the F-number=F1 is established is represented by a dashed line and the detection sensitivity γ when the F-number=F1.4 is established is represented by a solid line. In FIG. 8, the detection sensitivity γ of the infrared detection pixel at the position "0" is standardized to "100%".

As illustrated in FIG. 8, the detection sensitivity γ of the infrared detection pixel is the highest at the center of the light receiving surface and is reduced toward the end of the light receiving surface. The rate of decrease in the detection sensitivity γ varies depending on the F-number.

Therefore, the relationship illustrated in FIG. 2 is established for a pixel signal value which is output from the infrared detection pixel at the center of the light receiving surface. However, the relationship illustrated in FIG. 2 is not established for a pixel signal value which is output from the infrared detection pixel in an edge part of the light receiving surface.

Figure 9:
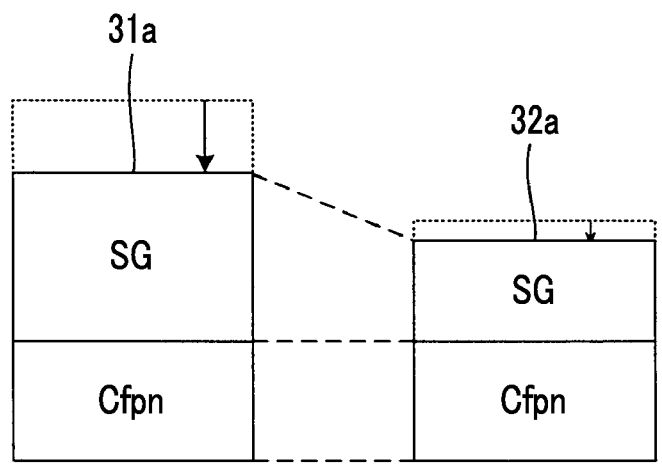
FIG. 9 is a diagram illustrating a pixel signal value output from an infrared detection pixel at a position "L" or "R".

FIG. 9 is a diagram illustrating a pixel signal value which is output from the infrared detection pixel at the position "L" or "R".

In FIG. 9, reference numeral 31*a* indicates a pixel signal value obtained by capturing an image in a state in which the F-number=F1 is established. Reference numeral 32*a* indicates a pixel signal value obtained by capturing an image in a state in which the F-number=F1.4 is established. In FIG. 9, the pixel signal values 31 and 32 illustrated in FIG. 2 are represented by dashed lines.

From the relationship illustrated in FIG. 2, a signal component SG of the pixel signal value 32*a* is less than a signal component SG of the pixel signal value 31*a*. However, from the relationship illustrated in FIG. 8, a reduction in the signal component is less than that in the infrared detection pixel at the center of the light receiving surface.

Therefore, it is preferable to calculate FPN, considering a variation in the ratio of the signal component SG of the pixel signal value of the first captured image data and the signal component SG of the pixel signal value of the second captured image data caused by a change in the position on the light receiving surface.

The relationship illustrated in FIG. 2, the relationship illustrated in FIG. 6, and the relationship illustrated in FIG. 8 are known. Therefore, the FPN calculation unit 19 sets a coefficient for making the signal component SG of the pixel signal value of the first captured image data equal to the signal component SG of the pixel signal value of the second captured image data to a value corresponding to the position of the infrared detection pixel on the light receiving surface, with reference to the data illustrated in FIGS. 2, 6, and 8.

The FPN calculation unit 19 multiplies at least one of the signal component SG of the pixel signal value of the first captured image data or the signal component SG of the pixel signal value of the second captured image data by the set coefficient.

The FPN calculation unit 19 calculates an FPN component $C_{fpn}$ from the difference between the signal component SG of the pixel signal value of the first captured image data and the signal component SG of the pixel signal value of the second captured image data after the multiplication.

In this way, it is possible to calculate FPN with high accuracy and to improve image quality.

The above-mentioned FPN calculation method will be described in detail using numerical expressions.

It is assumed that the digital value of a component corresponding to the amount of infrared rays radiated from the object among the pixel signal values at the coordinates (x, y) in the captured image data is $S_{obj}(x, y)$.

It is assumed that the digital value of an FPN component among the pixel signal values at the coordinates (x, y) in the captured image data is $C_{fpn}(x, y)$.

It is assumed that the infrared transmittance α illustrated in FIG. 2 at an arbitrary F-number is α(F). Here, α(F) is data stored in the main memory 16.

It is assumed that a pixel signal value corresponding to the amount of infrared rays radiated from the diaphragm 2 when the F-number is an arbitrary value and the temperature of the diaphragm 2 is T among the pixel signal values at the coordinates (x, y) in the captured image data is β(x, y, F, T). Here, β(x, y, F, T) is data which is experimentally calculated in advance and is recorded in the main memory 16.

It is assumed that the detection sensitivity γ of the infrared detection pixel at the coordinates (x, y) on the light receiving surface in a state in which the F-number is an arbitrary value is γ(x, y, F). Here, γ(x, y, F) is data which is experimentally calculated in advance and is stored in the main memory 16.

It is assumed that the digital value of the pixel signal value at the coordinates (x, y) in the captured image data is Out(x, y).

When the above-mentioned data is set in this way, Out(x, y) is represented by the following Expression (1).

$$\text{Out}(x, y) = S_{obj}(x, y) \times \alpha(F) \times \gamma(x, y, F) + \beta(x, y, F, T) + C_{fpn}(x, y) \quad (1)$$

Therefore, when the F-number=F1 is established, Out(x, y)$_{F1}$ is represented by the following Expression (2). When the F-number=F1.4 is established, Out(x, y)$_{F1.4}$ is represented by the following Expression (3).

$$\text{Out}(x, y)_{F1} = S_{obj}(x, y) \times \alpha(F1) \times \gamma(x, y, F1) + \beta(x, y, F1, T) + C_{fpn}(x, y) \quad (2)$$

$$\text{Out}(x, y)_{F1.4} = S_{obj}(x, y) \times \alpha(F1.4) \times \gamma(x, y, F1.4) + \beta(x, y, F1.4, T) + C_{fpn}(x, y) \quad (3)$$

When both sides are divided by $\alpha(F1) \times \gamma(x, y, F1)$ in Expression (2), Expression (2) can be changed to the following Expression (4).

$$\frac{1}{\alpha(F1) \times \gamma(x, y, F1)} \text{Out}(x, y)_{F1} = S_{obj}(x, y) + \frac{1}{\alpha(F1) \times \gamma(x, y, F1)} \beta(x, y, F1, T) + \frac{1}{\alpha(F1) \times \gamma(x, y, F1)} C_{fpn}(x, y) \quad (4)$$

When both sides are divided by $\alpha(F1.4) \times \gamma(x, y, F1.4)$ in Expression (3), Expression (3) can be changed to the following Expression (5).

$$\frac{1}{\alpha(F1.4) \times \gamma(x, y, F1.4)} \text{Out}(x, y)_{F1.4} = S_{obj}(x, y) + \frac{1}{\alpha(F1.4) \times \gamma(x, y, F1.4)} \beta(x, y, F1.4, T) + \frac{1}{\alpha(F1.4) \times \gamma(x, y, F1.4)} C_{fpn}(x, y) \quad (5)$$

When Expression (4) is subtracted from Expression (5), Expression (6) is obtained.

$$\frac{1}{\alpha(F1.4) \times \gamma(x, y, F1.4)} \text{Out}(x, y)_{F1.4} - \frac{1}{\alpha(F1) \times \gamma(x, y, F1)} \text{Out}(x, y)_{F1} = \frac{1}{\alpha(F1.4) \times \gamma(x, y, F1.4)} \beta(x, y, F1.4, T) - \frac{1}{\alpha(F1) \times \gamma(x, y, F1)} \beta(x, y, F1, T) + \left( \frac{1}{\alpha(F1.4) \times \gamma(x, y, F1.4)} - \frac{1}{\alpha(F1) \times \gamma(x, y, F1)} \right) C_{fpn}(x, y) \quad (6)$$

When Expression (6) is solved for $C_{fpn}(x, y)$, Expression (7) is obtained.

$$C_{fpn}(x, y) = \frac{\frac{1}{\alpha(F1.4) \times \gamma(x, y, F1.4)}(\text{Out}(x, y)_{F1.4} - \beta(x, y, F1.4, T)) - \frac{1}{\alpha(F1) \times \gamma(x, y, F1)}(\text{Out}(x, y)_{F1} - \beta(x, y, F1, t))}{\left( \frac{1}{\alpha(F1.4) \times \gamma(x, y, F1.4)} - \frac{1}{\alpha(F1) \times \gamma(x, y, F1)} \right)} \quad (7)$$

Since all of the numerical values in Expression (7) are known, it is possible to calculate the FPN component $C_{fpn}(x, y)$.

In Expression (7), $\{1/\alpha(F1.4) \times \gamma(x, y, F1.4)\}$ and $\{1/\alpha(F1) \times \gamma(x, y, F1)\}$ are coefficients which correspond to the difference between the F-number=F1 and the F-number=F1.4 and are used to make the values $S_{obj}(x, y)$ included in two pixel signal values, which are acquired while the F-number is changed, equal to each other.

A process in a case in which $\gamma(x, y, F)$ is "1" and $\beta(x, y, F, T)$ is "0" in Expression (7) is the same as that described in FIG. 2. A process in a case in which $\gamma(x, y, F)$ is "1" in Expression (7) is the same as that described in FIG. 7.

The FPN calculation method when a motion picture is captured has been described above. Next, an operation in a still image capture mode in which the imaging element 3 captures an image of an object one time in response to, for example, an instruction from the user and recording data obtained by processing the captured image data is recorded in the recording medium 21 will be described.

In the still image capture mode, the digital signal processing unit 17 combines a plurality of captured image data items acquired while the F-number of the diaphragm 2 is changed to generate one captured image data item, generates recording data from the captured image data, and records the recording data in the recording medium 21.

Figure 10:
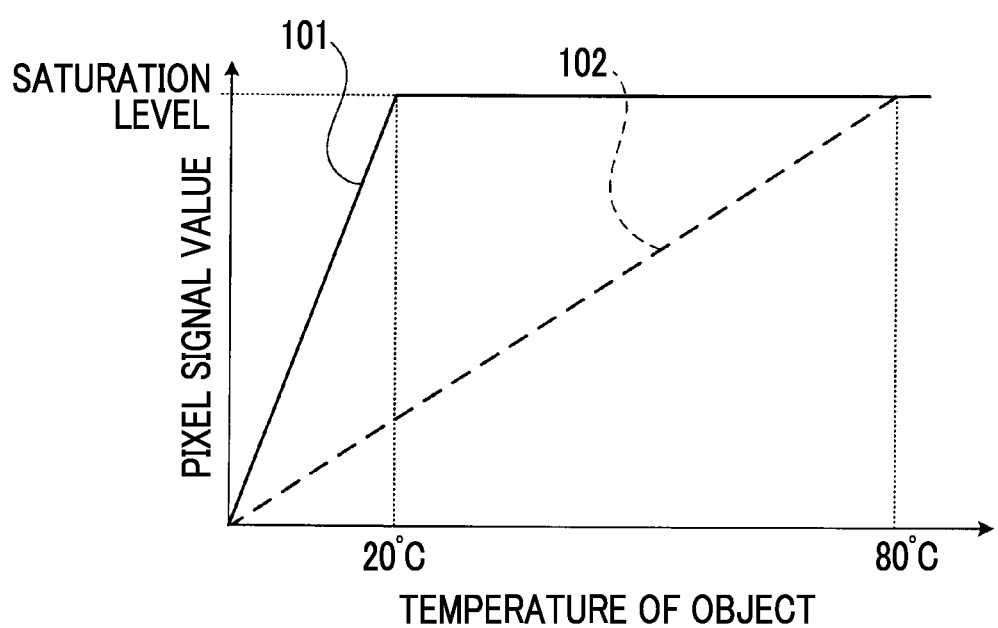
FIG. 10 is a diagram illustrating a change in the pixel signal value output from each infrared detection pixel of the imaging element 3 with respect to the temperature of the object (output response characteristics of the infrared detection pixel).

FIG. 10 is a diagram illustrating a change in the pixel signal value output from each infrared detection pixel of the imaging element 3 with respect to the temperature of the object (the output response characteristics of the infrared detection pixel).

In FIG. 10, reference numeral 101 indicates the output response characteristics of each infrared detection pixel in a state in which the F-number=F1 is established. Reference numeral 102 indicates the output response characteristics of each infrared detection pixel in a state in which the F-number=F1.4 is established.

Each of the output response characteristics 101 and the output response characteristics 102 indicates a pixel signal value from which the signal component ($\beta(x, y, F, T)$) corresponding to the infrared rays radiated from the diaphragm 2 has been excluded.

In a state in which the F-number=F1 is established, a large amount of infrared rays radiated from the object is incident on the imaging element 3. Therefore, the pixel signal value changes rapidly with respect to the temperature of the object.

In the example illustrated in FIG. 10, in a state in which the F-number=F1 is established, the pixel signal value is saturated for an object with a temperature of 20° C. or more. Therefore, it is possible to capture an image of an object with a temperature of less than 20° C. in a state in which the signal-to-noise ratio (S/N ratio) is high. However, it is difficult to accurately capture an image of an object with a temperature of 20° C. or more.

In a state in which the F-number=F1.4 is established, the amount of infrared rays incident on the imaging element 3 is less than that when the F-number=F1 is established. Therefore, the pixel signal value changes rapidly with respect to the temperature of the object.

In the example illustrated in FIG. 10, in a state in which the F-number=F1.4 is established, the pixel signal value is not saturated for an object with a temperature of less than 80° C. That is, it is possible to accurately capture an image of the object with a temperature of less than 80°. However, for the object with a temperature of less than 20° C., the pixel signal value is small and the S/N ratio is reduced.

In FIG. 10, the temperature (=20° C.) at which the infrared detection pixel reaches a saturation level when the F-number=F1 is established is referred to as a saturation temperature. In addition, the temperature (=80° C.) at which the infrared detection pixel reaches the saturation level when the F-number=F1.4 is established is referred to as the saturation temperature.

As such, when the F-number of the diaphragm 2 varies, the upper limit temperature (saturation temperature) of the object of which the image can be accurately captured varies.

It is assumed that a pixel signal value at the coordinate position (x, y) obtained in a state in which the F-number=F1 is established is Out(x, y, F1) and a pixel signal value at the coordinate position (x, y) obtained in a state in which the F-number=F1.4 is established is Out(x, y, F2). The digital signal processing unit 17 performs calculation represented by on the following Expression (8) on the basis of the settings to generate a pixel signal value D(x, y).

$$D(x, y) = \{Out(x, y, F1) - \beta(x, y, F1, T)\} \times a + \{Out(x, y, F1.4) - \beta(x, y, F1.4, T)\} \times b \qquad (8)$$

Figure 11:
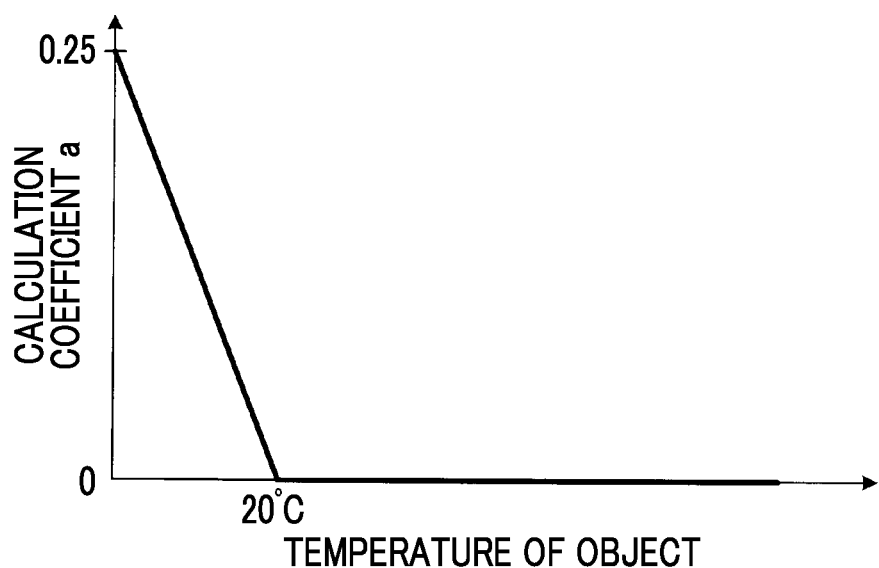

FIG. 11 is a diagram illustrating an example of a calculation coefficient a in Expression (8). As illustrated in FIG. 11, the calculation coefficient a is inversely proportional to the output response characteristics 101 in the range in which the temperature of the object is less than 20° C. The calculation coefficient a is "0", regardless of the temperature of the object, in the range in which the temperature of the object is equal to or greater than 20° C. When the temperature of the object is 0° C., the calculation coefficient a is "0.25" which is the ratio of the pixel signal value of the output response characteristics 101 to the pixel signal value of the output response characteristics 102 when the temperature of the object is 20° C. in FIG. 10.

Figure 12:
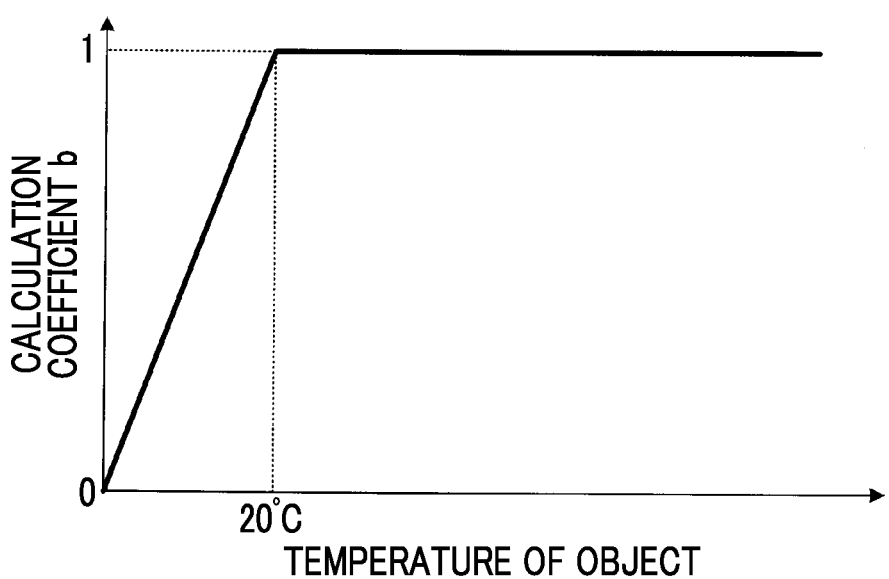
FIG. 12 is a diagram illustrating a calculation coefficient b.

FIG. 12 is a diagram illustrating an example of a calculation coefficient b in Expression (8). As illustrated in FIG. 12, the calculation coefficient b is proportional to the output response characteristics 101 in the range in which the temperature of the object is less than 20° C. The calculation coefficient b is "1", regardless of the temperature of the object, in the range in which the temperature of the object is equal to or greater than 20° C. When the temperature of the object is 0° C., the calculation coefficient b is "0".

The calculation coefficient a corresponds to the output response characteristics 101 (information indicating the relationship between the temperature of the object and the pixel signal value output from each infrared detection pixel of the imaging element) when the F-number=F1 is established.

The calculation coefficient a corresponds to the output response characteristics 102 (information indicating the relationship between the temperature of the object and the pixel signal value output from each infrared detection pixel of the imaging element) when the F-number=F1.4 is established.

Figure 13:
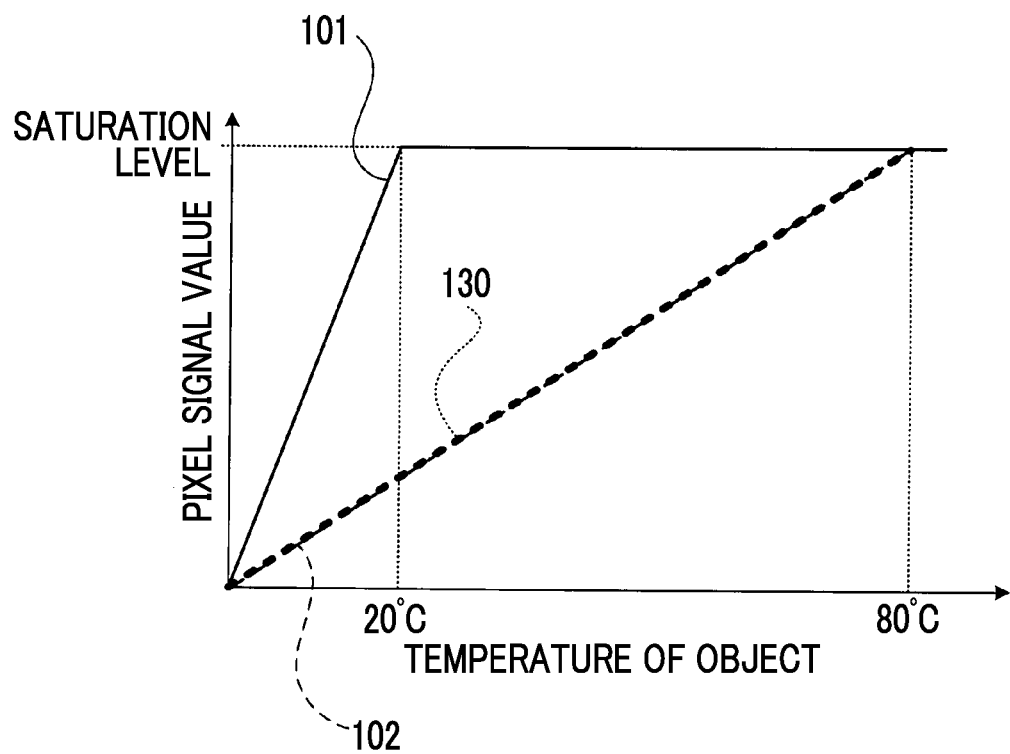
FIG. 13 is a diagram illustrating the combination result of two captured image data items.

The captured image data obtained by calculation represented by Expression (8) is equivalent to image data which is obtained by capturing an image of the object using an infrared detection pixel having output response characteristics represented by reference numeral 130 in FIG. 13.

The output response characteristics represented by the reference numeral 130 are the same as the output response characteristics 102 illustrated in FIG. 10. However, the result of the calculation represented by Expression (8) proves that, as the temperature of the object is reduced in the range in which the temperature of the object is equal to or less than 20° C., the proportion of $\{Out(x, y, F1) - \beta(x, y, F1, T)\}$ to the pixel signal value D(x, y) after composition increases.

In $\{Out(x, y, F1) - \beta(x, y, F1, T)\}$, the number of signal components is relatively high and the S/N ratio is higher than that in $\{Out(x, y, F1.4) - \beta(x, y, F1.4, T)\}$. Therefore, when an image of an object is captured by the infrared detection pixel with the output response characteristics represented by reference numeral 130 in FIG. 13, it is possible to capture an image of an object with a low temperature of less than 20° C. in a state in which each pixel signal value is not saturated and the S/N ratio is higher than that when the F-number=F1.4 is established.

In addition, it is possible to capture an image of an object in a temperature range that is equal to or greater than 20° C. and less than 80° C., without saturating each pixel signal value. Therefore, it is possible to improve imaging quality even in a scene in which both a low-temperature object and a high-temperature object are present.

In the above description, a processing of weighting a plurality of pixel signal values, which are acquired while the F-number is changed, with the calculation coefficients a and b and adding the pixel signal values is performed for each infrared detection pixel of the imaging element 3 to generate one captured image data item.

As a modification example, the digital signal processing unit 17 subtracts data corresponding to the infrared rays radiated from the diaphragm 2 from each of a plurality of captured image data items which are acquired while the F-number is changed. The digital signal processing unit 17 cuts out unsaturated portions from a plurality of captured image data items obtained by the subtraction and connects the out-out portions to generate one captured image data item.

Figure 14:
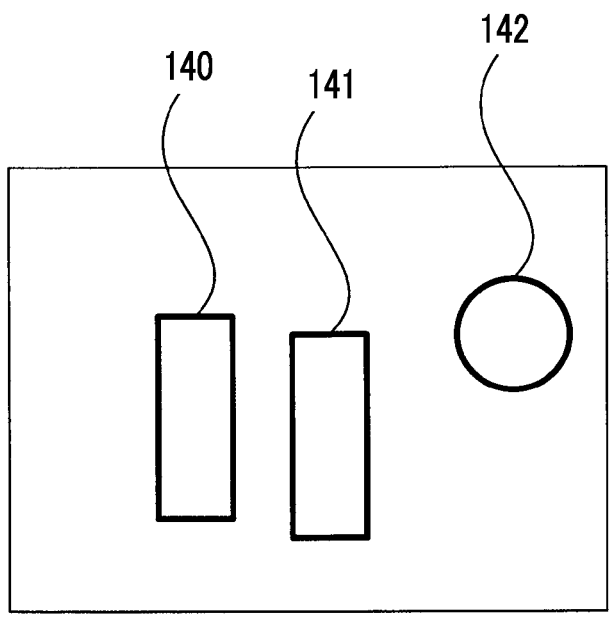
FIG. 14 is a diagram illustrating an example of the object of which the image is captured by the infrared imaging device illustrated in FIG. 1.

FIG. 14 is a diagram illustrating an example of the object of which the image is captured by the infrared imaging device illustrated in FIG. 1. FIG. 14 illustrates objects including objects 140, 141, and 142. In FIG. 14, it is assumed that the object 140 and the object 141 have the same temperature and the temperature of the object 142 is higher than the temperature of the objects 140 and 141.

Figure 15A:
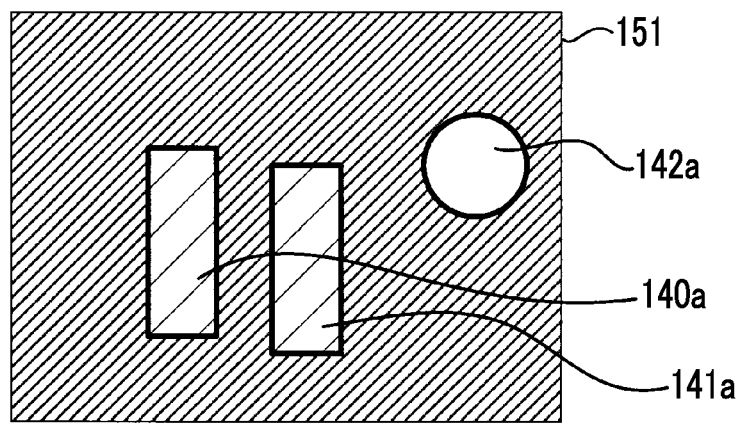
FIGS. 15A and 15B are diagrams illustrating captured image data obtained by capturing the image of the object illustrated in FIG. 14 while the F-number of the diaphragm 2 is changed to two values.
Figure 15B:
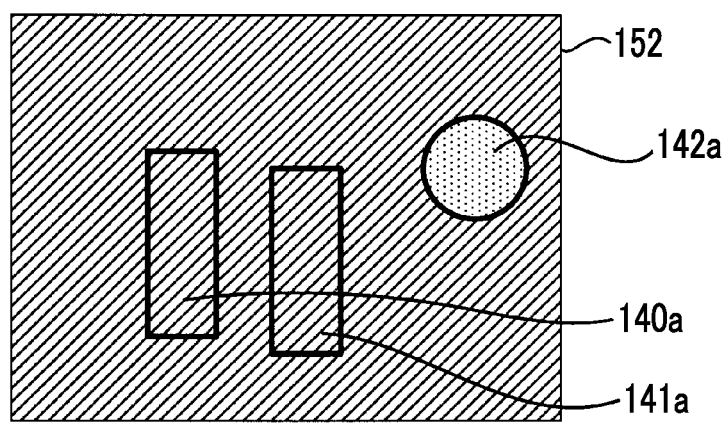

FIGS. 15A and 15B are diagrams illustrating captured image data which is obtained by capturing the image of the objects illustrated in FIG. 14 while the F-number of the diaphragm 2 is changed to two values.

FIG. 15A illustrates captured image data 151 which is captured at an F-number of, for example, F1. FIG. 15B illustrates captured image data 152 which is captured at an F-number of, for example, F1.4.

In FIGS. 15A and 15B, reference numeral 142a indicates data corresponding to the object 142 in FIG. 14. Reference numeral 140a indicates data corresponding to the object 140 in FIG. 14. Reference numeral 141a indicates data corresponding to the object 141 in FIG. 14.

In the examples illustrated in FIGS. 15A and 15B, each pixel signal value of the image data portion 142a reaches the saturation level at an F-number of F1 and each pixel signal value of the image data portion 142a is less than the saturation level at an F-number of F1.4.

At an F-number of F1 and an F-number of F1.4, each of the pixel signal values of the image data portions 140a and 141a is less than the saturation level. The level of each pixel signal value of the image data portions 140a and 141a at an F-number of F1.4 is lower than the level of each pixel signal value of the image data portions 140a and 141a at an F-number of F1.

In the examples illustrated in FIGS. 15A and 15B, the digital signal processing unit 17 detects the image data portion 142a in which a pixel signal value reaches the saturation level from the captured image data 151 and cuts out a portion other than the image data portion 142a from the captured image data 151.

The digital signal processing unit 17 subtracts the signal value ($\beta(x, y, F1, T)$) corresponding to the amount of infrared rays, which are radiated from the diaphragm 2 and are based on the F-number when the captured image data 151 is acquired and the temperature of the diaphragm 2 detected by the temperature detection unit 4, from each pixel signal value of the cut-out portion to generate first trimming data.

Then, the digital signal processing unit 17 compares each pixel signal value of an image data portion corresponding to the detected image data portion in the captured image data 152 with the saturation level to determine whether each pixel signal value is less than the saturation level. When each pixel signal value is less than the saturation level, the digital signal processing unit 17 cuts out the image data portion from the captured image data 152.

The digital signal processing unit 17 subtracts the signal value (β(x, y, F1.4, T)) corresponding to the amount of infrared rays, which are radiated from the diaphragm 2 and are based on the F-number when the captured image data 152 is captured and the temperature of the diaphragm 2 detected by the temperature detection unit 4, from each pixel signal value of the cut-out portion to generate second trimming data.

Figure 16:
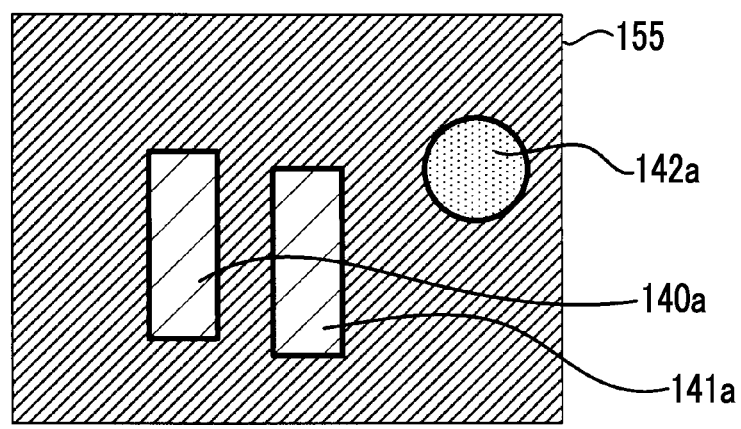
FIG. 16 is a diagram illustrating composite image data 155 obtained by combining captured image data 151 and captured image data 152.

Then, the digital signal processing unit 17 connects the first trimming data and the second trimming data to combine two captured image data items 151 and 152 and generates composite image data 155 illustrated in FIG. 16. The digital signal processing unit 17 processes the composite image data 155 to obtain recording data.

As described above, in a case in which a plurality of captured image data items acquired while the F-number is changed include captured image data (referred to as captured image data (1)) including an object portion in which a pixel signal value reaches the saturation level, the digital signal processing unit 17 specifies, from the plurality of captured image data items, captured image data which corresponds to the object portion, includes an object portion having a pixel signal value less than the saturation level, and is captured at the minimum F-number.

Then, the digital signal processing unit 17 substitutes the object portion of the captured image data (1) with data of the object portion included in the specified captured image data. In this way, even in a scene in which both a low-temperature object and a high-temperature object are present, it is possible to accurately capture the images of the two objects and to obtain composite image data.

In a case in which the plurality of captured image data items acquired while the F-number is changed do not include the captured image data including the object portion in which the pixel signal value reaches the saturation level, the digital signal processing unit 17 may process captured image data which is captured at the minimum F-number to generate recording data.

In the examples illustrated in FIGS. 15A and 15B, imaging is performed two times while the F-number is changed. However, imaging may be performed three or more times while the F-number is changed.

For example, the following case is considered: captured image data obtained at an F-number of F1 includes two saturated object portions and one of the two portions is saturated even at an F-number of F1.4 and is not saturated at an F-number of F2.

In this case, two object portions of the captured image data obtained at an F-number of F1 may be substituted with an object portion included in the captured image data obtained at an F-number of F1.4 and an object portion included in the captured image data obtained at an F-number of F2.

In the still image capture mode, as described above, imaging is performed a plurality of times while the F-number is changed. Therefore, it is possible to perform the above-mentioned FPN calculation process using a plurality of captured image data items obtained by a plurality of imaging operations. The digital signal processing unit 17 may subtract FPN data obtained by the FPN calculation process from the composite image data to perform FPN correction.

A program that causes a computer to perform each step performed by the FPN calculation unit 19 and the digital signal processing unit 17 according to this embodiment may be provided. The program is recorded in a non-transitory computer readable recording medium.

Examples of the "computer readable recording medium" include an optical medium, such as a compact disc-ROM (CD-ROM), and a magnetic recording medium, such as a memory card. In addition, the program may be provided by downloading through a network.

As described above, the specification discloses the following.

A disclosed infrared imaging device includes an imaging element including a plurality of infrared detection pixels which are two-dimensionally arranged; a diaphragm that is provided closer to an object than the imaging element; and a fixed pattern noise calculation unit that acquires a first captured image data obtained by capturing an image using the imaging element in a state in which an F-number of the diaphragm is set to a first value and a second captured image data obtained by capturing an image using the imaging element in a state in which the F-number of the diaphragm is set to a second value while a motion picture is being captured, and calculates fixed pattern noise included in captured image data obtained by capturing an image using the imaging element on the basis of the acquired first captured image data, the acquired second captured image data, the first value and the second value.

In the disclosed infrared imaging device, the first value is an F-number which is set in advance as an imaging condition while a motion picture is being captured. The infrared imaging device further includes a gain processing unit that multiplies the second captured image data by a gain. The gain processing unit sets the gain to a value corresponding to the difference between the second value and the first value.

The disclosed infrared imaging device further includes a moving body determination unit that determines whether a moving body is included in a captured object by comparing the first captured image data and the second captured image data. In a case where the moving body determination unit determines that the moving body is included in the object, the fixed pattern noise calculation unit stops the calculation of the fixed pattern noise.

In the disclosed infrared imaging device, the fixed pattern noise calculation unit multiplies at least one of two pixel signal values at an arbitrary coordinate position in each of the first captured image data and the second captured image data by a coefficient corresponding to a difference between the first value and the second value and calculates the fixed pattern noise at the arbitrary coordinate position using a difference between the two pixel signal values after the multiplication.

The disclosed infrared imaging device further includes a temperature detection unit that detects a temperature of the diaphragm. The fixed pattern noise calculation unit calculates the fixed pattern noise on the basis of the first captured image data, the second captured image data, the first value, the second value, and the temperature of the diaphragm detected by the temperature detection unit.

In the disclosed infrared imaging device, the fixed pattern noise calculation unit multiplies at least one of pixel signal values obtained by subtracting a signal value corresponding to infrared rays which are radiated from the diaphragm having the temperature from each of two pixel signal values at an arbitrary coordinate position in each of the first captured image data and the second captured image data by a coefficient corresponding to a difference between the first value and the second value, and calculates the fixed pattern noise at the arbitrary coordinate position using a difference between the two pixel signal values after the multiplication.

In the disclosed infrared imaging device, the fixed pattern noise calculation unit uses a value that varies depending on the position of the infrared detection pixel as the coefficient.

A disclosed fixed pattern noise calculation method is performed by an infrared imaging device including an imaging element including a plurality of infrared detection pixels which are two-dimensionally arranged and a diaphragm that is provided closer to an object than the imaging element. The fixed pattern noise calculation includes a fixed pattern noise calculation step of acquiring a first captured image data obtained by capturing an image using the imaging element in a state in which an F-number of the diaphragm is set to a first value and a second captured image data obtained by capturing an image using the imaging element in a state in which the F-number of the diaphragm is set to a second value while a motion picture is being captured, and calculating fixed pattern noise included in captured image data obtained by capturing an image using the imaging element on the basis of the acquired first captured image data, the acquired second captured image data, the first value, and the second value.

In the disclosed fixed pattern noise calculation method, the first value is an F-number which is set in advance as an imaging condition while a motion picture is being captured. The fixed pattern noise calculation method further includes a gain processing step of multiplying the second captured image data by a gain. In the gain processing step, the gain is set to a value corresponding to the difference between the second value and the first value.

The disclosed fixed pattern noise calculation method further includes a moving body determination step of determining whether a moving body is included in a captured object by comparing the first captured image data and the second captured image data. In the fixed pattern noise calculation step, in a case where it is determined that the moving body is included in the object in the moving body determination step, the calculation of the fixed pattern noise is stopped.

In the disclosed fixed pattern noise calculation method, in the fixed pattern noise calculation step, at least one of two pixel signal values at an arbitrary coordinate position in each of the first captured image data and the second captured image data is multiplied by a coefficient corresponding to a difference between the first value and the second value, and the fixed pattern noise at the arbitrary coordinate position is calculated using a difference between the two pixel signal values after the multiplication.

In the disclosed fixed pattern noise calculation method, the infrared imaging device further includes a temperature detection unit that detects a temperature of the diaphragm, and in the fixed pattern noise calculation step, the fixed pattern noise on the basis of the first captured image data, the second captured image data, the first value, the second value, and the temperature of the diaphragm detected by the temperature detection unit is calculated.

In the disclosed fixed pattern noise calculation method, in the fixed pattern noise calculation step, at least one of pixel signal values obtained by subtracting a signal value corresponding to infrared rays which are radiated from the diaphragm having the temperature from each of two pixel signal values at an arbitrary coordinate position in each of the first captured image data and the second captured image data is multiplied by a coefficient corresponding to a difference between the first value and the second value, and the fixed pattern noise at the arbitrary coordinate position is calculated using a difference between the two pixel signal values after the multiplication.

In the disclosed fixed pattern noise calculation method, in the fixed pattern noise calculation step, a value that varies depending on the position of the infrared detection pixel as the coefficient is used.

A disclosed fixed pattern noise calculation program causes an infrared imaging device including an imaging element including a plurality of infrared detection pixels which are two-dimensionally arranged and a diaphragm that is provided closer to an object than the imaging element to perform a fixed pattern noise calculation step of acquiring a first captured image data obtained by capturing an image using the imaging element in a state in which an F-number of the diaphragm is set to a first value and a second captured image data obtained by capturing an image using the imaging element in a state in which the F-number of the diaphragm is set to a second value while a motion picture is being captured, and calculating fixed pattern noise included in captured image data obtained by capturing an image using the imaging element on the basis of the acquired first captured image data, the acquired second captured image data, the first value and the second value.

INDUSTRIAL APPLICABILITY

The invention is particularly applied to, for example, in-vehicle cameras and is convenient and effective.

The invention has been described in detail above with reference to a specific embodiment. However, it will be understood by those skilled in the art that various modifications and changes of the invention can be made without departing from the scope and spirit of the invention.

This application is based on JP2014-200077 filed Sep. 30, 2014, the content of which is incorporated herein by reference.

EXPLANATION OF REFERENCES

2: diaphragm
3: imaging element
4: temperature detection unit
11: system control unit
17: digital signal processing unit (gain processing unit)
19: FPN calculation unit (moving body determination unit)

What is claimed is:
1. An infrared imaging device comprising:
an imaging element including a plurality of infrared detection pixels which are two-dimensionally arranged;
a diaphragm that is provided closer to an object than the imaging element; and
at least one hardware processor configured to:
acquire a first captured image data obtained by capturing an image with the imaging element in a state in which an F-number of the diaphragm is set to a first value and a second captured image data obtained by capturing an image with the imaging element in a state in which the F-number of the diaphragm is set to a second value while a motion picture is being captured, and calculates fixed pattern noise included in captured image data obtained by capturing an image with the imaging element based on the acquired first captured image data, the acquired second captured image data, the first value and the second value.

2. The infrared imaging device according to claim 1, wherein the at least one hardware processor is further configured to:
multiply the second captured image data by a gain,
wherein the first value is an F-number which is set in advance as an imaging condition while a motion picture is being captured, and
the at least one hardware processor sets the gain to a value corresponding to a difference between the second value and the first value.

3. The infrared imaging device according to claim 1, wherein the at least one hardware processor is further configured to:
determine whether a moving body is included in a captured object by comparing the first captured image data and the second captured image data,
wherein, in a case where the at least one hardware processor determines that the moving body is included in the object, the at least one hardware processor stops the calculation of the fixed pattern noise.

4. The infrared imaging device according to claim 1, wherein the at least one hardware processor multiplies at least one of two pixel signal values at an arbitrary coordinate position in each of the first captured image data and the second captured image data by a coefficient corresponding to a difference between the first value and the second value and calculates the fixed pattern noise at the arbitrary coordinate position using a difference between the two pixel signal values after the multiplication.

5. The infrared imaging device according to claim 1, further comprising:
a temperature sensor that detects a temperature of the diaphragm,
wherein the at least one hardware processor calculates the fixed pattern noise based on the first captured image data, the second captured image data, the first value, the second value and the temperature of the diaphragm detected by the temperature sensor.

6. The infrared imaging device according to claim 5, wherein the at least one hardware processor multiplies at least one of pixel signal values obtained by subtracting a signal value corresponding to infrared rays which are radiated from the diaphragm having the temperature from each of two pixel signal values at an arbitrary coordinate position in each of the first captured image data and the second captured image data by a coefficient corresponding to a difference between the first value and the second value, and calculates the fixed pattern noise at the arbitrary coordinate position using a difference between the two pixel signal values after the multiplication.

7. The infrared imaging device according to claim 4, wherein the at least one hardware processor uses a value that varies depending on the position of the infrared detection pixel as the coefficient.

8. The infrared imaging device according to claim 6, wherein the at least one hardware processor uses a value that varies depending on the position of the infrared detection pixel as the coefficient.

9. A fixed pattern noise calculation method that is performed by an infrared imaging device including an imaging element including a plurality of infrared detection pixels which are two-dimensionally arranged and a diaphragm that is provided closer to an object than the imaging element, the method comprising:
acquiring a first captured image data obtained by capturing an image with the imaging element in a state in which an F-number of the diaphragm is set to a first value and a second captured image data obtained by capturing an image with the imaging element in a state in which the F-number of the diaphragm is set to a second value while a motion picture is being captured, and calculating fixed pattern noise included in captured image data obtained by capturing an image with the imaging element based on the acquired first captured image data, the acquired second captured image data, the first value and the second value.

10. The fixed pattern noise calculation method according to claim 9, further comprising:
multiplying the second captured image data by a gain,
wherein the first value is an F-number which is set in advance as an imaging condition while a motion picture is being captured, and
the gain is set to a value corresponding to a difference between the second value and the first value.

11. The fixed pattern noise calculation method according to claim 9, further comprising:
determining whether a moving body is included in a captured object by comparing the first captured image data and the second captured image data,
wherein in a case of being determined that the moving body is included in the object, the calculation of the fixed pattern noise is stopped.

12. The fixed pattern noise calculation method according to claim 9,
wherein, in the calculation of the fixed pattern noise, at least one of two pixel signal values at an arbitrary coordinate position in each of the first captured image data and the second captured image data is multiplied by a coefficient corresponding to a difference between the first value and the second value, and the fixed pattern noise at the arbitrary coordinate position is calculated using a difference between the two pixel signal values after the multiplication.

13. The fixed pattern noise calculation method according to claim 9,
wherein the infrared imaging device further includes a temperature sensor that detects a temperature of the diaphragm, and
in the calculation of the fixed pattern noise, the fixed pattern noise based on the first captured image data, the second captured image data, the first value, the second value and the temperature of the diaphragm detected by the temperature sensor is calculated.

14. The fixed pattern noise calculation method according to claim 13,
wherein, in the calculation of the fixed pattern noise, at least one of pixel signal values obtained by subtracting a signal value corresponding to infrared rays which are radiated from the diaphragm having the temperature from each of two pixel signal values at an arbitrary coordinate position in each of the first captured image data and the second captured image data is multiplied by a coefficient corresponding to a difference between the first value and the second value, and the fixed pattern noise at the arbitrary coordinate position is calculated using a difference between the two pixel signal values after the multiplication.

15. The fixed pattern noise calculation method according to claim 12,
wherein, in the calculation of the fixed pattern noise, a value that varies depending on the position of the infrared detection pixel as the coefficient is used.

16. The fixed pattern noise calculation method according to claim 14,
wherein, in the calculation of the fixed pattern noise, a value that varies depending on the position of the infrared detection pixel as the coefficient is used.

17. A non-transitory computer readable medium storing a fixed pattern noise calculation program that causes an infrared imaging device including an imaging element including a plurality of infrared detection pixels which are two-dimensionally arranged and a diaphragm that is provided closer to an object than the imaging element to perform:

acquiring a first captured image data obtained by capturing an image with the imaging element in a state in which an F-number of the diaphragm is set to a first value and a second captured image data obtained by capturing an image with the imaging element in a state in which the F-number of the diaphragm is set to a second value while a motion picture is being captured, and calculating fixed pattern noise included in captured image data obtained by capturing an image with the imaging element based on the acquired first captured image data, the acquired second captured image data, the first value, and the second value.

18. The infrared imaging device according to claim 1, wherein the first captured image data and the second captured image data are recorded.

19. The infrared imaging device according to claim 1, wherein the first captured image data and the second captured image data are obtained by capturing the image of the object with the imaging element.

* * * * *